United States Patent
Kudo et al.

[11] Patent Number: 5,882,843
[45] Date of Patent: *Mar. 16, 1999

[54] PHOTOSENSITIVE RESIN COMPOSITION FOR COLOR FILTER PRODUCTION

[75] Inventors: Takanori Kudo; Yuko Nozaki; Kazuya Nagao; Yuki Nanjo, all of Saitama, Japan

[73] Assignee: Hoechst Japan Limited, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 557,841

[22] Filed: Nov. 14, 1995

[30] Foreign Application Priority Data

Nov. 15, 1994 [JP] Japan .................................. 6-305654

[51] Int. Cl.⁶ ........................... G03F 7/038; G03F 7/032
[52] U.S. Cl. ..................... 430/285.1; 430/280.1; 430/330; 522/63; 522/149; 522/129; 522/113
[58] Field of Search .................. 430/285.1, 280.1; 522/63, 149, 129, 113

[56] References Cited

U.S. PATENT DOCUMENTS 3,987,037 10/1976 Bonham et al. .................... 260/240 D
3,989,610 11/1976 Tsukada et al. ...................... 430/280.1
4,189,323 2/1980 Buhr ................................. 430/285.1
5,002,977 3/1991 Seko et al. ............................... 522/149

*Primary Examiner*—Cynthia Hamilton
*Attorney, Agent, or Firm*—Foley & Lardner

[57] ABSTRACT

A photosensitive resin composition is disclosed.

The photosensitive resin composition is characterized by containing (a) a reaction product of a polymer having a specific segment with (3,4-epoxycylohexyl)-methyl methacrylate, (b) a polymerization initiator allowing the initiation of the polymerization of said reaction product when irradiated with an actinic radiation, and (c) a solvent. Preferably, the composition further contains (d) a thermal crosslinker, a compound having a polymerizable unsaturated bond and/or a pigment in addition to the above ingredients.

According to the present invention, there is provided the photosensitive resin composition which has such excellent characteristics that it has high sensitivity, it does not require a heat treatment between exposure-development steps, it causes little change of sensitivity and pattern shape with time from the exposure to the development, it has high heat resistance, it permits the use of an aqueous system in the development step and it has good storage stability.

8 Claims, 1 Drawing Sheet

PHOTOSENSITIVE RESIN COMPOSITION FOR COLOR FILTER PRODUCTION

TECHNICAL FIELD

The present invention relates to a photosensitive resin composition for forming various patterns or film layers. The present invention also relates to a photosensitive resin composition for forming a colored image and, more specifically, to a photosensitive resin composition useful for preparing color filters used in liquid crystal display, imaging devices, etc.

BACKGROUND ART

A color filter used in a liquid crystal display, an imaging device or the like element generally has a construction in which pixels in a mosaic or stripe form are arranged on a transparent substrate such as a glass and has been hitherto prepared by a dyeing method (T. Uchida et al, Record of International Display Res. Conf. (1982), 166, IEEE Trans. ED-30 (1983) 503), an electrodeposition method (M. Suginoya et al, Proc. Japan Display '83 (1983 206) or a printing method (Tsuda et al, Proceedings of 13th Liquid Crystal Forum (1987) 22).

According to the dyeing method, a perchromate or a water soluble azide is added to a water soluble polymer such as gelatin, casein or polyacrylamide to impart photosensitivity thereto. After exposure, a development step is performed to obtain a relief pattern which in turn is colored to obtain a colored image. By repeating the coloring step for red, blue and green colors to obtain a color filter. To prevent color mixing, a coloration preventing treatment with tannic acid is performed between the respective coloring steps or an intermediate layer of an acrylic resin is formed. Thus, the dyeing method includes complicated steps, so that it is difficult to control the color tone. Further, the dyeing method has drawbacks that the water soluble polymer which is a dyeing medium has poor heat resistance and the color has poor heat resistance and poor weatherability.

To solve the above defects, studies have been made on the electrodeposition method, printing method and pigment dispersing method. With the electrodeposition method, however, the colored film is so thick that there are caused problems such as a large voltage drop and a limitation in pattern arrangement. The printing method has drawbacks because of poor dimensional accuracy and poor surface smoothness.

To solve the drawbacks of the conventional methods, there is proposed a pigment dispersing method. In this method, a pigment is dispersed in a photosensitive resin and the dispersion is applied onto a substrate. After drying, exposure and development are carried out to obtain a colored image. Thus, this method has a merit that it enables to obtain color filters by a simpler process in comparison with the dyeing method. A variety of photosensitive resins have been proposed for use in the pigment dispersing method, such as photosensitive polyimide resins disclosed in JP-A-60-237403, photosensitive resins composed of an acrylic polymer and an azide compound and disclosed in JP-A-1-200353, 4-7373 and 4-91173, photosensitive resins composed of an acrylate monomer, an organic polymer binder and a photopolymerization initiator and disclosed in JP-A-1-152449, and a chemically amplified-type photosensitive resins composed of a phenolic resin, a crosslinking agent having an N-methylol structure and an agent capable of generating an acid upon irradiation with a light and disclosed in JP-A-4-163552.

While a high heat resistance is obtainable when a photosensitive polyimide is used as the photosensitive resin for the pigment dispersing method, there are drawbacks because of low sensitivity and of necessity to use an organic solvent in the development step. With a conventional system in which an azide compound is used as the photosensitive agent, there involve problems because of low sensitivity, poor heat resistance and susceptibility to oxygen during the exposing step. A system in which radical polymerization of an acrylate monomer is utilized poses a problem that the exposure step is affected by oxygen, so that the sensitivity is reduced considerably, though the sensitivity is high. To avoid the influence of oxygen, therefore, it is necessary to form an oxygen barrier film or to perform the exposure in an inert atmosphere. But this requires a complicated process and an expensive apparatus. The chemically amplified-type photosensitive resin for forming a image by a catalytic reaction by an acid generated upon exposure can give high sensitivity and is not adversely affected by oxygen during exposure. However, there involves a problem because it is necessary to introduce a heating step between the exposure and development steps and because the sensitivity and the pattern shape are affected by a period of time from the exposure to the development, so that it is difficult to control the process. Further, the conventional photosensitive resin composition has drawbacks that the stability during storage is not good.

On the other hand, the conventional pigment-free photosensitive resin composition has the same drawbacks as those in the above-mentioned, photosensitive resin composition used for the preparation of a color filter by using the pigment dispersion method. In the conventional pigment-free photosensitive resin composition, sufficient consideration has not been taken for the chemical resistance, heat resistance and transparency of a cured body obtained through an exposure step. Thus, when the conventional pigment-free photosensitive resin composition is used as a protective material for a coloring material layer, there are caused problems of poor heat resistance and poor chemical resistance, so that a considerable change of color occurs by heating and peeling occurs upon contact with chemicals. Under the existing circumstances, further improvement is desired.

It is, therefore, an object of the present invention to provide a photosensitive resin composition which has such excellent characteristics that it has high sensitivity, it does not require a heat treatment between exposure-development steps, it causes little change of sensitivity and pattern shape with time from the exposure to the development, it has high heat resistance, it permits the use of an aqueous system in the development step and it has good storage stability.

It is another object of the present invention to provide a pigment-free, photosensitive resin composition which has good heat resistance and good chemical resistance and which has a long shelf life.

DISCLOSURE OF THE INVENTION

The present inventors have made an extensive study in view of the foregoing circumstance and found that the use of a mixture having the following composition can permit easy polymerization and formation of an image by development without any heat treatment after the exposure. As a result, the present invention has been accomplished.

Thus, according to the present invention there is provided a photosensitive resin composition characterized in that said composition includes as essential ingredients:

(a) a reaction product of a polymer having a segment represented by the following formula (I) with (3,4-epoxycylohexyl)methyl methacrylate,

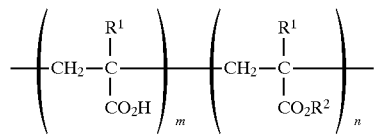

wherein $R^1$ may be the same or different and each represents a hydrogen atom or a methyl group, $R^2$ represents a straight or branched chain $C_1$–$C_5$ alkyl group, m and n represent a degree of polymerization, and m/n=0.5–2.4 (molar ratio), (b) a polymerization initiator allowing the initiation of the polymerization of said reaction product when irradiated with an actinic radiation, and (c) a solvent.

In a preferred embodiment of the present invention, said composition containing the ingredients (a)–(c) further comprises: (d) a thermal crosslinker and/or a compound having a polymerizable unsaturated bond.

These photosensitive resin compositions are preferably used as a pattern-forming material or a film-forming material which needs heat resistance and chemical resistance.

In another preferred embodiment of the present invention, said composition containing the ingredients (a)–(c) or (a)–(d) further comprises: (e) a pigment.

These photosensitive resin compositions are suitably adopted to a pigment dispersing method for the preparation of color filters.

The present invention will now be described in detail below.

In the present invention, a reaction product of a polymer having a segment represented by the following formula (I) with (3,4-epoxycyclohexyl)methyl methacrylate is used as a binder:

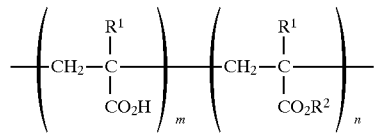

wherein $R^1$ may be the same or different and each represents a hydrogen atom or a methyl group, $R^2$ represents a straight or branched chain $C_1$–$C_5$ alkyl group, m and n represent a degree of polymerization, and m/n=0.5–2.4 (molar ratio)

In the above formula (I), it is preferable that at least one of $R^1$ is a methyl group, and $R^2$ is a $C_1$–$C_4$ alkyl group, especially a n-butyl group. It is also preferable that the polymer having a segment represented by the formula (I) is a polymer having a segment represented by the following formula

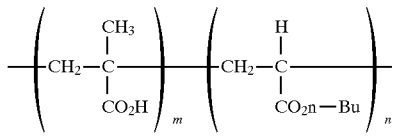

wherein m and n have the same meaning as above.

The ratio m/n is preferably 0.5–2.4, and more preferably 0.6–1.7 in molar ratio.

The molecular weight (Mw) of the reaction product of a polymer having a segment represented by the above formula (I) with (3,4-epoxycyclohexyl)methyl methacrylate is preferably 10,000–80,000, and more preferably 15,000–40,000. The acid value of the reaction product is preferably 40–100 KOH mg/g, and more preferably 45–70 KOH mg/g.

As the polymerization initiator allowing the initiation of the polymerization the reaction product when irradiated with an actinic radiation in the present invention, there may be employed halomethyl oxazole compounds, halomethyl-s-triazine compounds, onium salts, benzoin ethers, benzophenones, xanthones, acetophenones, azido compounds, etc.

Examples of the halomethyl oxazole compounds are (2-trichloromethyl-5-styryl-1,3,4-oxadiazole, 2-trichloromethyl-5-(p-cyanostyryl)-1,3,4-oxadiazole, 2-trichloromethyl-5-(p-methoxystyryl)-1,3,4-oxadiazole, etc.

As the halomethyl-s-triazine compounds, there may be employed trihalomethyl-s-triazine compounds. Examples of the trihalomethyl-s-triazine compounds are 2,4-bis (trichloromethyl)-6-p-methoxystyryl-s-triazine, 2,4-bis (trichloromethyl)-6-(1-p-dimethylaminophenyl-1,3-butadienyl)-s-triazine, 2,4-bis(trichloromethyl)-6-(p-phenylstyryl)-s-triazine, 2,4-bis(trichloromethyl)-6-styryl-s-triazine, 2,4-bis(trichloromethyl)-6-phenyl-s-triazine, 2[2' (5''-methylfuryl)ethylidene ]-4,6-bis(trichloromethyl)-s-triazine, 2(2'-furylethylidene)-4,6-(trichloromethyl)-s-triazine, 5,7-bis(tribromomethyl)-s-triazolo[1,5-a]pyrimidine, etc.

The above compounds may be used singly or as a mixture of two or more.

Examples of the benzoin ethers are benzoin methyl ether, benzoin isobutyl ether, etc. Examples of the benzophenones are acetophenone, 2,2-dimethoxy-2-phenylacetophenone, 1,1-dichloroacetophenone, Michler's ketone, o-benzoylmethylbenzoate, etc. Examples of the xanthones are xanthone, thioxanthone, 2-chlorothioxanthone, 2-alkylthioxanthone, 2,4-dialkylthioxanthone, etc.

Examples of the derivatives of acetophenones are acetophenone, trichloroacetophenone, 2,2-diethoxyacetophenone, 2,2-dimethoxy-2-phenylacetophenone, etc. Examples of the azido compounds are 4,4'-diazidestilbene, 4,4'-diazidestilbene-2,2'-disulfone-N,N-diethyleneoxyethylamide, p-azidebenzal acetophenone, azidecalcone, etc.

As the onium salts, there may be employed sulfonium salts, iodonium salts, diazonium salts, etc. Illustrative of these salt are triphenylsulfonium trifluoromethane sulfonate, benzil-4-hydroxyphenylmethylsulfonium hexafluorophosphate, α-naphtylmethyl-4-hydroxyphenylmethylsulfonium hexafluorophosphate or its hexafluoroantimonate, diphenyl-t-butyl-phenylsulfonium trifluoromethane sulfonate, diphenylmethoxyphenylsulfonium hexafluoroantimonate, triphenylsulfonium hexafluoro antimonate, di-t-butylphenyliodonium trifluoromethane sulfonate or its hexafluoro antimonate or its tetrafluoroborate, methoxyphenylphenyliodonium trifluoromethane sulfonate, diphenyliodonium trifluoromethane sulphonate, aminophenyl-benzenediazonium tetrafluoroborate, pylendiazonium tetrafluoroborate, etc.

These may be used singly or as a mixture of two or more.

In the present invention, it is preferable to use a halomethyl-s-triazine compounds, especially trihalomethyl-s-triazine compound as a polymerization initiator in view of the image-forming characteristics and of the combination with of the ingredient (a) as a binder.

In the present invention, a sensitizer may be used in combination for improving the sensitivity. Examples of the sensitizers include 2-nitrofluorene, 2,4,7-trinitrofluorenone, benzanthrone, picramide, 1,2-benzanthraquinone, 11-chloro-6-hydroxybenzanthrone, phenanthranquinone, 4, (4-butoxyphenyl)-2,6-diphenylthiopyryliumperchlate, etc.

As the pigment in the present invention, there may be used, for example, organic pigments such as condensed polycyclic pigments, e.g. anthraquinone-type and perylene-type pigments, phthalocyanine pigments azo pigments, and inorganic pigments such as carbon black. These pigments may be used singly or as a mixture of two or more.

In the present invention, it is preferable to use a dispersant for dispersing the pigment in the mixture. The dispersant may be added into the pigment such that the pigment is previously surface-treated therewith. Alternatively, the dispersant may be added in a form separated from the pigment. Nonionic, anionic or cationic dispersant may be used. Rosin and unsaturated carboxylic acid-modified rosin may also be used. The amount of the dispersant is 0–50 wt %, preferably 0–35 wt % based on the weight of the pigment.

As the solvent used in the present invention, there may be mentioned ethyl cellosolve, propylene glycol monomethyl ether acetate (PGMEA), ethyl lactate, polyethylene glycol, polypropylene glycol, cyclohexane or propylene glycol methyl ether. These may be used singly or as a mixed solvent. A stabilizer, an antioxidant, etc. may be added to the mixture of the present invention.

It is preferred that the mixture of the present invention contain various thermal crosslinker and/or a compound having a polymerizable unsaturated bond for improving cracking resistance and resistance to solvents. Such thermal crosslinker may be, for example, a compound having at least two, different or same residues, such as alkoxy and acyloxy, capable of reacting with the binder to form a crosslinked matrix. Examples of the crosslinker include bis-, tris- or tetra-hydroxymethyl-substituted aromatic compounds or heterocyclic aromatic compounds; bis, tris- or tetra-acetoxymethyl-substituted aromatic compounds or heterocyclic aromatic compounds; melamines having N-hydroxymethyl groups, N-alkoxymethyl groups or N-acyloxymethyl groups; epoxy compounds such as novolak epoxy resins, bisphenol A type epoxy resins, halogenated bisphenol A type epoxy resins and alicyclic epoxy resins; acetal resins such as polyvinylbutyrals; peroxides such as benzoyl peroxide, parachlorobenzoyl peroxide, acetyl peroxide and lauroyl peroxide; block isocyanates; blocked isocyanates obtained by blocking isocyanates such as isophorone diisocyanate, haxamethylene diisocyanate and cyclohexylene diisocyanate with various blocking agents such as ethanol, butanol, dimetyl malonate, imidazole, ε-caprolactam, methyl cellosove and ethylene glycol. These may be used by themselves or in combination of two or more.

As the compound having a polymerizable unsaturated bond, there may be mentioned various vinyl monomers and oligomers. Illustrative of such compounds are an acrylic acid monomer, an acrylic acid oligomer, a methacrylic acid monomer, a methacrylic acid oligomer, an acrylate and a methacrylate. The acrylate and methacrylate may be acrylic and methacrylic acid esters of a polyhydric alcohol such as ethylene glycol or trimethylolpropanol. Acrylic and methacrylic acid esters of a polymer having alcoholic hydroxyl groups, such as polyvinyl alcohol, may be also included in the acrylate and methacrylate. Also included in the present invention are acrylate melamine, methacrylate melamine, urethane acrylate and urethane methacrylate.

More concrete examples of such compound include 2-hydroxyethyl methacrylate, n-butyl methacrylate, glycidyl methacrylate, 2-ethylhexyl acrylate, diethylene glycol dimethacrylate, polyethylene glycol methacrylate, trimethylolethane tetramethacrylate and tetramethylolmethane tetramethacrylate. These compounds may be used by themselves or in combination of two or more.

The proportion of the ingredients in the composition according to the present invention except the solvent (c) and the pigment (e) is preferably such that the content of the reaction product (a) is 70–98% by weight and the content of the compound (b) is 30–2% by weight. The amount of the thermal crosslinker/or the compound having a polymerizable unsaturated bond (d) when used is 0.01–0.25 part by weight, more preferably 0.025–0.2 part by weight, most preferably 0.03–0.15 part by weight, per 1 part by weight of the ingredient (a). When the amount of the ingredient (d) exceeds the above range, the viscosity of the composition increases to grow sticky. It is preferred that the compound (b) is used in an amount of 30–2% by weight, based on the total weight of the ingredient (a) and ingredient (d). The amount of the pigment is 0.1–2 parts by weight, per 1 part by weight of the above mixture. The solvent (c) is suitably used in an amount of 1–15 parts by weight, preferably 2–10 parts by weight, per 1 part by weight of the total ingredients other than the solvent.

The substrate onto which the composition of the present invention is applied may be formed of any known material which is generally used for the construction of capacitors, semiconductors, multi-layer printed circuit boards and integrated circuits. Thus, the substrate may be, for example, a thermally oxidized silicon material, an aluminum-coated silicon material which may be doped as desired, a silicon nitride material, a gallium-arsenic material or a indium phosphide. Further, a glass plate, a metal plate, a metal foil (such as of aluminum, copper or zinc), a metal deposited plate, silicon oxide or aluminum-deposited silicon oxide may also be used as the substrate.

These substrate may be surface-treated by heating, grinding, etching or chemicals to improve the surface characteristics thereof such as hydrophilicity. The chemical treatment may be a treatment for improving the adhesion between the substrate and the composition by a silane coupling agent. Especially when the substrate is made of silicon or silicon dioxide, 8-aminopropyltriethoxysilane or hexamethyldisilazane may be suitably used as the silane coupling agent. Such an adhesion improving layer may have a thickness of generally 0.1–100 μm, preferably 0.5–10 μm.

The composition according to the present invention may be applied on a substrate by spray coating, curtain coating, roll coating, spin coating, dip coating or any other suitable method. The solvent is then removed by evaporation to leave the pattern-forming material on the substrate. The removal of the solvent may be accelerated by heating and/or evacuation, if desired. In this case, it is important that the heating should be performed at a temperature where the deterioration of the pattern-forming material or the substrate material is not caused. For example, the heating may be performed at a temperature of up to 150° C. The layer is then irradiated with an actinic radiation so that a desired pattern is formed. After irradiation, the coated layer is treated with a developer to dissolve the unirradiated portion thereof to form a required pattern. The layer may be subjected to heating after irradiation but before development. The heat treatment can further improve the physical properties such as a sensitivity. The heating may be performed at a such temperature that the shape of the pattern or the substrate material is not deteriorated. For example, the heating may be performed at a temperature of 200° C. or less. The source of the radiation is generally a UV of 190–450 nm, preferably 200–400 nm. If desired, radiation of an electron beam or X-ray beam may be suitably used.

A color filter may be prepared by using the composition containing a pigment according to the present invention in the following manner. The composition is applied on a glass substrate, for example, by any suitable coating method as described above to form a coated layer having a thickness of, for example, 0.5–10 μm. The glass substrate may have a black matrix formed thereon. The layer is then irradiated with an actinic radiation so that a desired pattern of the color filter is formed. During the irradiation, it is not necessary to remove oxygen. Thus, the irradiation can be carried out without use of an inert gas. such as nitrogen and without use of a protecting film for shielding oxygen. After irradiation, the coated layer is treated with a developer to dissolve the unirradiated portion thereof to form a pattern required for the color filter. The above procedures are repeated for necessary colors, thereby obtaining a color filter having the desired pattern. In the above procedures, the image pattern as obtained after the development may be further hardened by heating or irradiation with an actinic radiation for improving the cracking resistance and solvent resistance.

In the present invention, the pattern is considered to be formed as follows. Thus, by the irradiation with an actinic radiation, the compound (b) generates radicals or ions. The radicals or ions are then reacted with the unsaturated bonds of the ingredient (a) to form a crosslinked matrix so that the irradiated portion is insolubilized in an aqueous alkali solution. The developer may contain, for example, ammonia or a silicate, metasilicate, hydroxide, hydrogen-phosphate of an alkali metal, alkaline earth metal or, especially, ammonium ion. As a metal-free developer, there may be used the conventional agent disclosed in, for example, U.S. Pat. No. 4,729,941 and EP-A-62,733. If desired, a surfactant, a detergent or an organic solvent may be added into the developing liquid for the purpose of supplementing the removal of pigment residues during the development. Such additives to be added to the developer for the above-mentioned purposes may be, for example, a nonionic surfactant, an ionic surfactant, an alcohol, a carboxylic acid, an amine or a derivative thereof. Concrete examples of the additives include polyalkylene glycols or esters thereof, polyoxyalkylenes, alkylene oxide adducts of polyhydric alcohol esters, alkylene oxide adducts of alcohols, alkylene oxide adducts of alkylphenols, sulfonic acid esters, sulfonic acid salts, carboxylic acid esters, carboxylic acid salts, alkylene oxide adducts of alkylamides and alkylamines. These additives may be used by themselves or in combination of two or more. The amount of the additive is preferably 0.1–30% by weight based on the weight of the developer.

The photosensitive resin composition according to the present invention includes polymerizable unsaturated bonds in the base polymer. Therefore, the polymer can easily polymerize by radicals or ions generated from the compound (b). Thus, a good pattern with good sensitivity is obtainable upon the development.

Further, since the base polymer (ingredient (a)) and the compound (b) used in the present invention has little tendency to turn yellow, the decrease of the transmittance due to yellow coloring is not found after the manufacturing process of a color filter, and the resulting colored pattern has good color tone.

EXAMPLES

Figure 1:
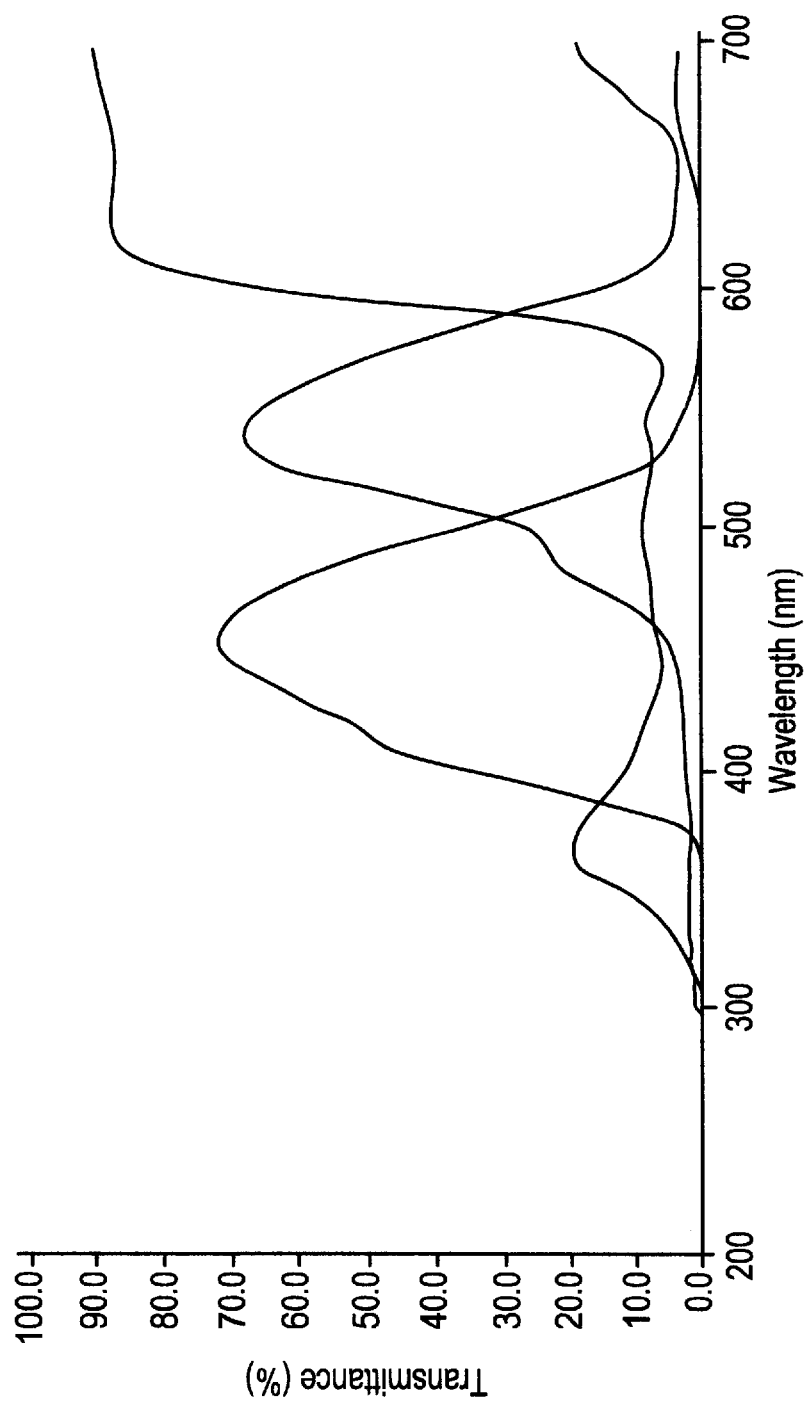
FIG. 1 is a transmission spectrum in a visible region of the colored layer of the color filter obtained in Example 1.

The present invention will be further described in more detail by way of examples. The present invention is, however, not limited to the examples. Base polymers used in the examples are shown in Table 1.

TABLE 1

| Abbreviation | Structure and physical properties |
|---|---|
| Polymer I | (3,4-epoxycyclohexyl)methyl methacrylate adduct of methacrylic acid-methyl methacrylate copolymer acid value: 40 KOH mg/g Mw: 15,600 double-bond equivalent: 450 |
| Polymer II | (3,4-epoxycyclohexyl)methyl methacrylate adduct of methacrylic acid-methyl methacrylate copolymer acid value: 40 KOH mg/g Mw: 27,600 double-bond equivalent: 450 |
| Polymer III | (3,4-epoxycyclohexyl)methyl methacrylate adduct of methacrylic acid-methyl acrylate copolymer acid value: 50 KOH mg/g Mw: 27,000 double-bond equivalent: 450 |
| Polymer IV | (3,4-epoxycyclohexyl)methyl methacrylate adduct of methacrylic acid-methyl acrylate copolymer acid value: 60 KOH mg/g Mw: 25,000 double-bond equivalent: 450 |
| Polymer V | (3,4-epoxycyclohexyl)methyl methacrylate adduct of methacrylic acid-n-butyl acrylate copolymer acid value: 55 KOH mg/g Mw: 25,000 double-bond equivalent: 450 |
| Polymer VI | (3,4-epoxycyclohexyl)methyl methacrylate adduct of methacrylic acid-n-butyl acrylate copolymer acid value: 51 KOH mg/g Mw: 28,000 double-bond equivalent: 450 |
| Polymer VII | (3,4-epoxycyclohexyl)methyl methacrylate adduct of methacrylic acid-n-butyl acrylate copolymer acid value: 60 KOH mg/g Mw: 24000 double-bond equivalent: 450 |
| Polymer VIII | (3,4-epoxycyclohexyl)methyl methacrylate adduct of methacrylic acid-n-butyl acrylate copolymer acid value: 55 KOH mg/g Mw: 15,000 double-bond equivalent: 450 |
| Polymer IX | (3,4-epoxycyclohexyl)methyl methacrylate adduct of methacrylic acid-n-butyl acrylate copolymer acid value: 60 KOH mg/g Mw: 47,000 double-bond equivalent: 450 |
| Polymer X | (3,4-epoxycyclohexyl)methyl methacrylate adduct of methacrylic acid-n-butyl methacrylate copolymer acid value: 55 KOH mg/g Mw: 16,000 double-bond equivalent: 450 |
| Polymer XI | (3,4-epoxycyclohexyl)methyl methacrylate adduct of acrylic acid-n-butyl acrylate copolymer acid value: 68 KOH mg/g Mw: 15,000 double-bond equivalent: 450 |

Example 1

A clean glass substrate was used as a transparent substrate for the preparation of a color filter. The following photosensitive resin compositions were prepared.

(1) Composition for Red Coloration

| | |
|---|---|
| Polymer I | 95 g |
| 2,4-bis(trichloromethyl)-6-styryl-s-triazine | 5 g |
| Red pigment dispersion containing dispersant (Pigment Content: 17 wt %) | 290 g |

To the above composition, propylene glycol monomethyl ether acetate was added as a solvent to obtain a composition in which the content of the ingredients except the solvent was 20% by weight.

(2) Composition for Blue Coloration

The above procedure for the preparation of the red composition was repeated in the same manner as described except that 175 g of a blue pigment dispersion containing a dispersant (pigment content: 17% by weight) were used in place of the red pigment dispersion.

(3) Composition for Green Coloration

The above procedure for the preparation of the red composition was repeated in the same manner as described except that 290 g of a green pigment dispersion containing a dispersant (pigment content: 17% by weight) were used in place of the red pigment dispersion.

Onto the glass substrate were applied the above compositions by spin coating each to a thickness of about 1.5 μm. Each coated layer was dried at 100° C. for 1 minute on a hot plate. The exposure of each of the colored photosensitive resin layers was carried out with a high pressure mercury lamp using a mask of a predetermined shape. The resulting pattern-exposed, colored photosensitive resin layer was then developed with a 0.15 N aqueous tetramethylammonium hydroxide solution. The thus obtained colored pattern had uniform colors and had sharp edges.

The thickness and clarity (transmittance) of the colored layer of the thus obtained color filter are shown in Table 2. The transmission spectra of the colored layers containing red, blue and green pigments in a visible region are shown in FIG. 1.

TABLE 2

| Color | Wavelength | Clarity | Thickness |
|---|---|---|---|
| red | 620 nm | 90% | 1.5 μm |
| blue | 460 nm | 76% | 1.5 μm |
| green | 540 nm | 70% | 1.5 μm |

Example 2

Example 1 was repeated in the same manner as described except that Polymer II was substituted for Polymer I and that 2(2'-furylethylidene-4,6-(trichloromethyl)-s-triazine was substituted for 2,4-bis(trichloromethyl)-6-styryl-s-triazine to obtain photosensitive resin compositions. Using these compositions, the procedure of Example 1 was repeated in the same manner as described, thereby obtaining a colored pattern having uniform colors and sharp edges.

Example 3

Example 1 was repeated in the same manner as described except that Polymer III was substituted for Polymer I and that 2,4-bis(trichloromethyl)-6-(p-phenylstyryl)-s-triazine was substituted for 2,4-bis(trichloromethyl)-6-styryl-s-triazine to obtain photosensitive resin compositions. Using these compositions, the procedure of Example 1 was repeated in the same manner as described except that the development was performed with a 0.1 N aqueous tetramethylammonium hydroxide solution. The thus obtained colored pattern had sharp edges, although residues were observed somewhat.

Example 4

Example 3 was repeated in the same manner as described except that Polymer IV was substituted for Polymer III to obtain photosensitive resin compositions. Using these compositions, the procedure of Example 3 was repeated in the same manner as described. The thus obtained colored pattern had sharp edges, although residues were observed somewhat.

Example 5

Example 2 was repeated in the same manner as described except that Polymer II (90 g) and 2[2'(5"-methylfuryl)ethylidene]-4,6-(trichloromethyl)-s-triazine (100 g) were used to obtain photosensitive resin compositions. Using these compositions, the procedure of Example 2 was repeated in the same manner as described, thereby obtaining a colored pattern having uniform colors and sharp edges.

Example 6

The following photosensitive resin compositions were prepared.

(1) Composition for Red Coloration

| | |
|---|---|
| Polymer I | 87.5 g |
| trimethoxymethyltri(2-hydroxyethyl acrylate methyl) melamine | 7.5 g |
| 2,4-bis(trichloromethyl)-6-styryl-s-triazine | 5 g |
| Red pigment dispersion containing dispersant (Pigment Content: 17 wt %) | 290 g |

To the above composition, propylene glycol monomethyl ether acetate was added as a solvent to obtain a composition in which the content of the ingredients except the solvent was 20% by weight.

(2) Composition for Blue Coloration

The above procedure for the preparation of the red composition was repeated in the same manner as described as described except that 175 g of a blue pigment dispersion containing a dispersant (pigment content: 17% by weight) were used in place of the red pigment dispersion.

(3) Composition for Green Coloration

The above procedure for the preparation of the red composition was repeated in the same manner as described except that 290 g of a green pigment dispersion containing a dispersant (pigment content: 17% by weight) were used in place of the red pigment dispersion. Using the above compositions, the procedure of Example 1 was repeated in the same manner as described, thereby obtaining a colored pattern having uniform colors and sharp edges.

Example 7

Example 6 was repeated in the same manner as described except that Polymer II was substituted for Polymer I and that 2(2'-furylethylidene)-4,6-(trichloromethyl)-s-triazine was substituted for 2,4-bis(trichloromethyl)-6-styryl-s-triazine to obtain photosensitive resin compositions. Using these compositions, the procedure of Example 6 was repeated in the same manner as described, thereby obtaining a colored pattern having uniform colors and sharp edges.

Example 8

Example 6 was repeated in the same manner as described except that polymer II was substituted for Polymer I and that hexamethoxymethyl melamine was substituted for trimethoxymethyltri(2-hydroxyethyl acrylate methyl) melamine to obtain photosensitive resin compositions. Using these compositions, the procedure of Example 6 was repeated in the same manner as described, thereby obtaining a colored pattern having uniform colors and sharp edges.

Example 9

A clean glass substrate was used as a transparent substrate for the preparation of a color filter. The following photosensitive resin compositions were prepared.
(1) Composition for Red Coloration

| | |
|---|---|
| Polymer V | 95 g |
| 2,4-bis(trichloromethyl)-6-(p-styrylphenyl)-s-triazine | 5 g |
| Red pigment dispersion containing dispersant (Pigment Content: 17 wt %) | 290 g |

To the above composition, propylene glycol monomethyl ether acetate was added as a solvent to obtain a composition in which the content of the ingredients except the solvent was 20% by weight.
(2) Composition for Blue Coloration The above procedure for the preparation of the red composition was repeated in the same manner as described except that 175 g of a blue pigment dispersion containing a dispersant (pigment content: 17% by weight) were used in place of the red pigment dispersion.
(3) Composition for Green Coloration The above procedure for the preparation of the red composition was repeated in the same manner as described except that 290 g of a green pigment dispersion containing a dispersant (pigment content: 17% by weight) were used in place of the red pigment dispersion.

Onto a glass substrate were applied the above compositions by spin coating each to a thickness of about 1.5 μm. Each coated layer was dried at 100° C. for 1 minute on a hot plate. The exposure of each of the colored photosensitive resin layers was carried out with a high pressure mercury lamp using a mask of a predetermined shape. The resulting pattern-exposed, colored photosensitive resin layer was then developed with a 0.1 N aqueous tetramethylammonium hydroxide solution. The thus obtained colored pattern had uniform colors and had sharp edges.

The above compositions were left at a room temperature for three months. Thereafter, the above procedure was repeated in the same manner as described to obtain a colored pattern. The thus obtained colored pattern also had uniform color and had sharp edges.

Example 10

Example 9 was repeated in the same manner as described except that Polymer VI was substituted for Polymer V to obtain photosensitive resin compositions. Using these compositions, the procedure of Example 9 was repeated in the same manner as described, thereby obtaining a colored pattern having uniform colors and sharp edges.

Example 11

Example 9 was repeated in the same manner as described except that Polymer VII was substituted for Polymer V to obtain photosensitive resin compositions. Using these compositions, the procedure of Example 9 was repeated in the same manner as described, thereby obtaining a colored pattern having uniform colors and sharp edges.

Example 12

The following photosensitive resin compositions were prepared.
(1) Composition for Red Coloration

| | |
|---|---|
| Polymer V | 92 g |
| trimethoxymethyltri(2-hydroxyethyl acrylate methyl) melamine | 3 g |
| 2,4-bis(trichloromethyl)-6-(p-styrylphenyl)-s-triazine | 5 g |
| Red pigment dispersion containing dispersant (Pigment Content: 17 wt %) | 290 g |

To the above composition, propylene glycol monomethyl ether acetate was added as a solvent to obtain a composition in which the content of the ingredients except the solvent was 20% by weight.
(2) Composition for Blue Coloration The above procedure for the preparation of the red composition was repeated in the same manner as described except that 175 g of a blue pigment dispersion containing a dispersant (pigment content: 17% by weight) were used in place of the red pigment dispersion.
(3) Composition for Green Coloration The above procedure for the preparation of the red composition was repeated in the same manner as described except that 290 g of a green pigment dispersion containing a dispersant (pigment content: 17% by weight) were used in place of the red pigment dispersion.
(4) Composition for Black Coloration for Black Matrix The above compositions for red, blue and green coloration were mixed with each other in an equal amount to obtain a black color composition.
(5) Composition for Black Coloration for Black Matrix The above procedure for the preparation of the red composition was repeated in the same manner as described except that 120 g of a carbon black dispersion containing a dispersant (pigment content: 17% by weight) were used in place of the red pigment dispersion.
(6) Composition for Black Coloration for Black Matrix The above procedure for the preparation of the black composition (4) was repeated in the same manner as described except that 5 g of carbon black were additionally incorporated.

Using the above six kinds of the compositions, the procedure of Example 1 was repeated in the same manner as described except that the development was performed with a 0.1 N aqueous tetramethylammonium hydroxide solution. The thus obtained colored pattern having uniform colors and sharp edges.

The above compositions were left at a room temperature for three months. Thereafter, the above procedure was repeated in the same manner as described to obtain a colored pattern. The thus obtained colored pattern also had uniform color and had sharp edges.

Examples 13–18

The above procedure for the preparation of each of the compositions (1)–(3) in Example 12 was repeated in the same manner as described except that each of Polymer VI (Example 13), Polymer VII (Example 14), Polymer VIII (Example 15), Polymer IX (Example 16), Polymer X (Example 17) and Polymer XI (Example 18) was substituted for Polymer V to obtain photosensitive resin compositions. Using these compositions, the procedure of Example 12 was repeated in the same manner as described, thereby obtaining a colored pattern having uniform colors and sharp edges.

Example 19

Example 12 was repeated in the same manner as described except that the amount of 2,4-bis(trichloromethyl)-6-(p-styrylphenyl)-s-triazine used was changed from 5 g to 7 g to obtain photosensitive compositions. Using these compositions, the procedure of Example 12 was repeated in the same manner as described, thereby obtaining a colored pattern having uniform colors and sharp edges.

Example 20

Example 12 was repeated in the same manner as described except that 10 g of blocked hexamethylene diisocyanate were additionally incorporated to obtain photosensitive compositions. Using these compositions, the procedure of Example 12 was repeated in the same manner as described, thereby obtaining a colored pattern having uniform colors and sharp edges.

Example 21

The above procedure for the preparation of each of the compounds (1)–(3) in Example 12 was repeated in the same manner as described except that 5 g of bisphenol A type epoxy resin (average molecular weight: about 1000) were additionally incorporated to obtain photosensitive compositions. Using these compositions, the procedure of Example 12 was repeated in the same manner as described, thereby obtaining a colored pattern having uniform colors and sharp edges.

Example 22

Using the compositions prepared in Example 12, the procedure of Example 12 was repeated in the same manner as described except that the development was performed with a 0.005 N aqueous potassium hydroxide solution. The thus obtained colored pattern had uniform colors and sharp edges.

Example 23

Each of the colored patterns obtained in Examples 1–22 was heated at 230° C. for 15 minutes on a hot plate. After being allowed to be cooled, each pattern was immersed in propylene glycol monomethyl ether acetate for 10 minutes and then observed with a microscope. No deterioration of the shape of the pattern was observed, indicating that the patterns of Examples 1–22 showed good solvent resistance. It was revealed that the photosensitive resin compositions according to the present invention had good solvent resistance and were useful for the preparation of color filters.

Example 24

The following photosensitive resin compositions were prepared.

| | |
|---|---|
| Polymer V | 92 g |
| trimethoxymethyltri(2-hydroxyethyl acrylate methyl) melamine | 3 g |
| 2,4-bis(trichloromethyl)-6-(p-styrylphenyl)-s-triazine | 5 g |

To the above composition, propylene glycol monomethyl ether acetate was added as a solvent to obtain a composition in which the content of the ingredients except the solvent was 20% by weight.

Using the compositions, the procedure of Example 1 was repeated in the same manner as described except that the development was performed with a 0.0054 N aqueous tetramethylammonium hydroxide solution. The thus obtained colored pattern had uniform colors and had sharp edges.

The colored pattern was then heated and cured at 230° C. for 15 minutes on a hot plate. After being allowed to be cooled, the colored pattern was immersed in propylene glycol monomethyl ether acetate for 10 minutes and then observed with a microscope. No deterioration of the shape of the pattern was observed, indicating that the pattern showed good solvent resistance. When the cured pattern was further heated at 260 C. for 1 hour in air, the variation in transmittance in the range from 400 nm to 700 nm was within 5 %, indicating that the pattern showed good heat resistance. It was revealed that the colored, photosensitive resin compositions according to the present invention had good heat resistance and good solvent resistance, and were useful for the preparation of pattern-forming materials and film-forming materials.

Example 25

Example 24 was repeated in the same manner as described except that 2.5 g of blocked hexamethylene diisocyanate (coronate 2507:Nippon Polyurethane Co., Ltd.) were additionally incorporated to obtain photosensitive resin compositions. Using these compositions, the procedure of Example 1 was repeated in the same manner as described except that the development was performed with a 0.05% aqueous potassium hydroxide solution. The thus obtained colored pattern had uniform colors and had sharp edges.

Example 26

Example 24 was repeated in the same manner as described except that 1 g of bisphenol A type epoxy resin (average molecular weight: about 1,000) was additionally incorporated to obtain photosensitive resin compositions. Using these compositions, the procedure of Example 1 was repeated in the same manner as described except that the development was performed with a 0.0054 N aqueous tetramethylammonium hydroxide solution. The thus obtained colored pattern had uniform colors and had sharp edges.

Example 27

Example 24 was repeated in the same manner as described except that 0.5 g of benzoyl peroxide was additionally incorporated to obtain photosensitive resin compositions. Using these compositions, the procedure of Example 1 was repeated in the same manner as described except that the development was performed with a 0.0054 N aqueous tetramethylammonium hydroxide solution. The thus obtained colored pattern had uniform colors and had sharp edges.

Example 28

Each of the colored patterns obtained in Examples 24–27 was heated and cured at 230° C. for 15 minutes on a hot plate. After being allowed to be cooled, each pattern was immersed in propylene glycol monomethyl ether acetate for 10 minutes and then observed with a microscope. No deterioration of the shape of the pattern was observed, indicating that the patterns of Examples 24–27 showed good solvent resistance. When the cured pattern was further heated at 260 C. for 1 hour in air, the variation in transmittance in the range from 400 nm to 700 nm was within 5 %, indicating that the pattern showed good heat resistance. It was revealed that the photosensitive resin compositions according to the present invention had good heat resistance and solvent resistance, and were useful for the preparation of pattern-forming materials and film-forming materials.

Example 29

Example 12 was repeated in the same manner as described except that 10 g of 2-benzyl-2-dimethylamino-1-(4-morpholinophenyl)-butanone-1 were used in place of 5 g of 2,4-bis(trichloromethyl)-6-(p-styrylphenyl)-s-triazine to obtain photosensitive resin compositions. Using these compositions, the procedure of Example 12 was repeated in the same manner as described except that the development was performed with a 0.1 N aqueous tetramethylammonium hydroxide solution. The thus obtained colored pattern had sharp edges, although a slight peeling was observed.

Example 30

Example 12 was repeated in the same manner as described except that 8 g of 2,2-dimethoxy-1,2-diphenylethane-1-one were used in place of 5 g of 2,4-bis(trichloromethyl)-6-(p-styrylphenyl)-s-triazine to obtain photosensitive resin compositions. Using these compositions, the procedure of Example 12 was repeated in the same manner as described. The thus obtained colored pattern had sharp edges, although a slight peeling was observed.

Example 31

Example 12 was repeated in the same manner as described except that 10 g of 4,4'-diazidostilbene-disulfone-N,N-diethyleneoxyethylamide were used in place of 5 g of 2,4-bis(trichloromethyl)-6-(p-styrylphenyl)-s-triazine to obtain photosensitive resin compositions. Using these compositions, the procedure of Example 12 was repeated in the same manner as described. The thus obtained colored pattern had sharp edges, although a slight peeling was observed.

Example 32

Example 12 was repeated in the same manner as described except that 5 g of triphenylsulfonium trifluoromethanesulfonate were used in place of 5 g of 2,4-bis(trichloromethyl)-6-(p-styrylphenyl)-s-triazine and that a low pressure mercury lamp was used as the light source for exposure to obtain photosensitive resin compositions. Using these compositions, the procedure of Example 12 was repeated in the same manner as described. The thus obtained colored pattern had sharp edges, although a slight peeling was observed.

Example 33

Each of the colored patterns obtained in Examples 29–32 was heated and cured at 230° C. for 15 minutes on a hot plate. After being allowed to be cooled, each pattern was immersed in propylene glycol monomethyl ether acetate for 10 minutes and then observed with a microscope. No deterioration of the shape of the pattern was observed, indicating that the patterns of Examples 29–32 showed good solvent resistance. It was revealed that the photosensitive resin compositions according to the present invention had good solvent resistance and were useful for the preparation of color filters.

Comparative examples will be explained in order to clarify the predominance of the photosensitive resin compositions according to the present invention. Base polymers used in the comparative examples are shown in Table 3.

TABLE 3

| Abbreviation | Structure and physical properties |
| --- | --- |
| Polymer A | (3,4-epoxycyclohexyl)methyl acrylate adduct of methacrylic acid-n-butyl acrylate copolymer acid value: 58 KOH mg/g Mw: 23,000 double-bond equivalent: 450 |
| Polymer B | (3,4-epoxycyclohexyl)methyl acrylate adduct of methacrylic acid-methyl methacrylate copolymer acid value: 57 KOH mg/g Mw: 20,000 double-bond equivalent: 450 |

Comparative Example 1

Example 9 was repeated in the same manner as described except that Polymer A was used in place of Polymer V to obtained photosensitive resin compositions. Using these compositions, the procedure of Example 9 was performed in the same manner as described, obtaining a colored pattern. The colored pattern formed by using the compositions immediately after the preparation thereof had uniform colors and sharp edges. However, the colored pattern formed by using the compositions which had been left at a room temperature for three months had much peeling and much residues, and showed poor storage stability.

Comparative Example 2

Example 9 was repeated in the same manner as described except that Polymer B was used in place of Polymer V to obtained photosensitive resin compositions. Using these compositions, the procedure of Example 9 was performed in the same manner as described, obtaining a colored pattern. The colored pattern formed by using the compositions immediately after the preparation thereof had uniform colors and sharp edges. However, the colored pattern formed by using the compositions which had been left at a room temperature for three months had much peeling and much residues, and showed poor storage stability.

Comparative Example 3

Example 12 was repeated in the same manner as described except that Polymer A was used in place of Polymer V to obtained photosensitive resin compositions. Using these compositions, the procedure of Example 12 was performed in the same manner as described, obtaining a colored pattern. The colored pattern formed by using the compositions immediately after the preparation thereof had uniform colors and sharp edges. However, the colored pattern formed by using the compositions which had been left at a room temperature for three months had much peeling and much residues, and showed poor storage stability.

From the above examples and comparative examples, the followings are clearly appreciated.

(1) From the comparison of Example 9 and 12 with Comparative Examples 1–3, the composition using a polymer having a methacryloyl group in its side chain is seen to be superior in storage stability as compared with that using a polymer having an acryloyl group in its side chain.

(2) From Examples 1–22 and Examples 29–32, it is seen that a trihalomethyl-s-triazine compound is suitable as a polymerization initiator in the present invention.

(3) From the comparison of Examples 3 and 4 using the base polymer represented by the above formula (I) in which $R^1$ is a methyl group with Examples 10 and 11 using the base polymer represented by the above formula (I) in which $R^2$ is a butyl group, the latter type of the composition can form better pattern with little residues, provided the molecular weight and the acid value thereof are the same.

Since the photosensitive resin composition according to the present invention contains a binder resin comprised of a reaction product of a polymer having a segment represented by the above formula (I) with (3,4-epoxycyclohexyl)methyl methacrylate, a polymerization initiator allowing the initiation of the polymerization of said reaction product irradiated with an actinic radiation, and a solvent, it has good heat resistance, good solvent resistance, good storage stability, etc.

Further, since the photosensitive resin composition according to the present invention has the above construction, the production of a color filter does not require an oxygen barrier film and does not require heating during the period of from the exposure step to the development step. Thus, the use of the composition permits the color filter production steps to be made significantly simple so that the composition provides a great value in industrial utilization.

We claim:

1. A photosensitive resin composition for color filter production wherein said composition comprises:

(a) a reaction product of a polymer having a segment represented by the following formula (I) with (3,4-epoxycylohexy) methyl methacrylate:

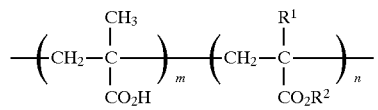

wherein $R^1$ represents a hydrogen atom or a methyl group, $R^2$ is n-butyl, m and n represent a degree of polymerization, and m/n=0.6–1.7 (molar ratio), wherein said reaction product has a molecular weight (Mw) of 15,000 to 40,000 and an acid value within the range from 40 to 100 KOH mg/g, (b) a halomethyl-s-triazine compound,
   (c) a solvent,
   (d) a thermal crosslinker,
   (e) a compound having a polyrrmerizable unsaturated bond, and
   (f) a pigment, wherein (d) and (e) comprises trimethoxymethyltri(2-hydroxyethyl acrylate methyl) melamine.

2. A photosensitive resin composition as recited in claim 1, characterized in that the polymer represented by the formula (I) is a polymer represented by the following formula (II):

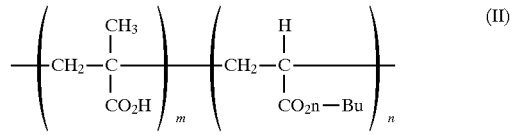

wherein m and n have the same meaning as above.

3. The composition as claimed in claim 1, wherein the acid value of said reaction product (a) is within the range of from 45 to 70 KOH mg/g.

4. The composition as claimed in claim 1, wherein said halomethyl-s-triazine is one or more trihalomethyl-s-triazines selected from the group consisting of 2,4-bis(trichloromethyl)-6-p-methoxystyryl-s-triazine, 2,4-bis(trichloromethyl)-6-(1-p-dimethylaminophenyl-1,3-butadienyl)-s-triazine, 2,4-bis(trichloromethyl)-6-p-phenylstyryl)-s-triazine, 2,4-bis(trichloromethyl)-6-styryl-s-triazine, 2,4-bis(trichloromethyl)-6-phenyl-s-triazine, 2(2'(5"-methylfuryl)ethylidene)-4,6-bis(trichloromethyl)-s-triazine, 2(2'-furylethylidene)-4,6-(trichloromethyl)-s-triazine and 5,7-bis(tribromomethyl)-s-triazolo(1,5-a)pyrinidine.

5. The composition as claimed in claim 1, wherein said solvent (c) is one or more solvents selected from the group consisting of ethyl cellosolve, propylene glycol, monomethyl ether acetate, ethyl lactate, polyethylene glycol, polypropylene glycol, cyclohexane and propylene glycol methyl ether.

6. The composition as claimed in claim 1, wherein said thermal crosslinker (d) is present in an amount of from 0.03 to 0.15 parts by weight, per 1 part by weight of ingredient (a).

7. The composition as claimed in claim 1, wherein said compound having a polymerizable unsaturated bond (e) is present in an amount of from 0.03 to 0.15 parts by weight, per 1 part by weight of ingredient (a).

8. The composition as claimed in claim 1, wherein the composition further comprises blocked hexamethylene diisocyanate.

* * * * *